(12) United States Patent
Suzumura et al.

(10) Patent No.: US 9,620,526 B2
(45) Date of Patent: Apr. 11, 2017

(54) THIN FILM TRANSISTOR AND DISPLAY DEVICE USING THE SAME

(71) Applicant: Japan Display Inc., Tokyo (JP)

(72) Inventors: Isao Suzumura, Tokyo (JP); Norihiro Uemura, Tokyo (JP); Hidekazu Miyake, Tokyo (JP); Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/015,445

(22) Filed: Feb. 4, 2016

(65) Prior Publication Data

US 2016/0163741 A1  Jun. 9, 2016

Related U.S. Application Data

(62) Division of application No. 14/573,124, filed on Dec. 17, 2014, now abandoned.

(30) Foreign Application Priority Data

Dec. 20, 2013 (JP) ................................. 2013-263772

(51) Int. Cl.
| | |
|---|---|
| *H01L 29/786* | (2006.01) |
| *H01L 27/12* | (2006.01) |
| *H01L 29/66* | (2006.01) |
| *H01L 21/473* | (2006.01) |
| *H01L 21/02* | (2006.01) |
| *H01L 21/3213* | (2006.01) |

(52) U.S. Cl.
CPC .... *H01L 27/1225* (2013.01); *H01L 21/02071* (2013.01); *H01L 21/02164* (2013.01); *H01L 21/02211* (2013.01); *H01L 21/02274* (2013.01); *H01L 21/32138* (2013.01); *H01L 21/32139* (2013.01); *H01L 21/473* (2013.01); *H01L 27/127* (2013.01); *H01L 27/1248* (2013.01); *H01L 29/66969* (2013.01); *H01L 29/7869* (2013.01); *H01L 29/78693* (2013.01)

(58) Field of Classification Search
CPC ............ H01L 29/7869; H01L 27/1225; H01L 27/124; H01L 29/4908; H01L 29/41733; H01L 51/0545; H01L 27/3244
See application file for complete search history.

(56) References Cited

U.S. PATENT DOCUMENTS

| | | | | |
|---|---|---|---|---|
| 6,526,996 B1 * | 3/2003 | Chang | ............... | H01L 21/02071 134/1.2 |
| 7,169,637 B2 * | 1/2007 | Zhang | ................. | H01L 45/1675 257/E21.49 |

(Continued)

FOREIGN PATENT DOCUMENTS

| | | |
|---|---|---|
| JP | 2010-067849 A | 3/2010 |
| JP | 2013-004606 A | 1/2013 |

*Primary Examiner* — Jaehwan Oh
(74) *Attorney, Agent, or Firm* — Typha IP LLC (57) ABSTRACT

There is provided a bottom gate channel etched thin film transistor that can suppress initial Vth depletion and a Vth shift. A thin film transistor is formed, including a gate electrode interconnection disposed on a substrate, a gate insulating film, an oxide semiconductor layer to be a channel layer, a stacked film of a source electrode interconnection and a first hard mask layer, a stacked film of a drain electrode interconnection and a second hard mask layer, and a protective insulating film.

13 Claims, 8 Drawing Sheets

(56) References Cited

U.S. PATENT DOCUMENTS

| | | | | |
|---|---|---|---|---|
| 7,498,625 | B2* | 3/2009 | Takamatsu | H01L 21/32051 257/295 |
| 9,006,024 | B2* | 4/2015 | Akimoto | H01L 29/66765 257/350 |
| 2008/0258141 | A1* | 10/2008 | Park | H01L 29/78618 257/43 |
| 2008/0303030 | A1* | 12/2008 | Sakai | H01L 27/1214 257/72 |
| 2010/0059747 | A1 | 3/2010 | Nakayama et al. | |
| 2011/0127525 | A1* | 6/2011 | Yamazaki | H01L 29/7869 257/43 |
| 2011/0133191 | A1* | 6/2011 | Yamazaki | H01L 27/1225 257/57 |
| 2011/0265813 | A1* | 11/2011 | Okai | C23F 4/00 134/1.1 |
| 2012/0211755 | A1* | 8/2012 | Fujimori | H01L 29/78606 257/59 |
| 2013/0056729 | A1* | 3/2013 | Misaki | H01L 27/1225 257/43 |
| 2013/0063675 | A1* | 3/2013 | Misaki | H01L 29/7869 349/46 |
| 2014/0209896 | A1* | 7/2014 | Yamazaki | H01L 29/66969 257/43 |

\* cited by examiner

THIN FILM TRANSISTOR AND DISPLAY DEVICE USING THE SAME

CROSS REFERENCE TO RELATED APPLICATION

This application is a divisional application of U.S. patent application Ser. No. 14/573,124, filed on Dec. 17, 2014, which claims priority from Japanese Patent Application JP 2013-263772 filed on Dec. 20, 2013, the entire contents of which are hereby incorporated by reference into this application.

BACKGROUND

The present invention relates to a thin film transistor using an oxide semiconductor for a channel layer and a display device using the same.

A display device includes a TFT substrate on which pixels having a pixel electrode, a thin film transistor (TFT), and the like are formed in a matrix configuration and the TFT substrate is disposed opposite to a counter substrate on which a color filter or the like is formed at a location corresponding to the pixel electrode of the TFT substrate. In a liquid crystal display device, liquid crystal is sandwiched between a TFT substrate and a counter substrate. The light transmittance of liquid crystal molecules is controlled for individual pixels, and images are formed.

Presently, with a rapid spread of Smartphones (registered trademark) and tablet devices, a liquid crystal display (LCD) adapted to these devices is strongly demanded to have high definition, low power consumption, and a decrease in cost. In order to meet these demands, the development of an oxide TFT for an LCD TFT substrate is actively conducted, which uses TAOS (Transparent Amorphous Oxide semiconductors) having a mobility greater than the mobility of amorphous Si (a-Si), more specifically an IGZO (Indium Gallium Zinc Oxide) film for a channel layer (see Japanese Patent Application Laid-Open No. 2010-67849, for example). Moreover, micro-processing techniques for interconnections are disclosed in Japanese Patent Application Laid-Open No. 2013-4606, for example.

SUMMARY

The inventors investigated the application of a bottom gate channel etched TFT for a TFT substrate for use in a liquid crystal display device (LCD), in which an oxide semiconductor layer is used for a channel layer. The reason why the bottom gate channel etched TFT was used is that the bottom gate channel etched TFT is advantageous to a decrease in cost. Moreover, a dry etching method was used for patterning a conductive film to form a source electrode and a drain electrode on a channel layer. In the case where a-Si is used for a channel layer, an acid solution can be used to etch a conductive film. This is because an oxide semiconductor such as IGZO (Indium Gallium Zinc Oxide) has properties that the oxide semiconductor is easily etched with an acid solution. Moreover, in association with a display panel of high definition, it is demanded to decrease the width of a source electrode interconnection and a drain electrode interconnection in order to improve the aperture ratio and to decrease parasitic capacitance. From this point of view, an Al interconnection material having a low sheet resistance was used for a conductive film. In consequence, a chlorine gas was used for an etching gas. It is noted that in order to suppress side etching on a processed side wall in dry etching an Al interconnection material, etching was conducted under the conditions for forming a side wall protective film made of a carbon material due to a resist in dry etching.

As a result, it was revealed that a phenomenon such as initial threshold voltage (Vth) depletion and a Vth shift occurs in the TFT.

It is an object of the present invention to provide a bottom gate channel etched thin film transistor that can suppress initial Vth depletion and a Vth shift and a high definition display device using the same.

An embodiment to achieve the object is a bottom gate channel etched thin film transistor using an oxide semiconductor layer for a channel layer. The thin film transistor includes: a substrate; a gate electrode interconnection formed on the substrate; a gate insulating film formed on the gate electrode interconnection; an oxide semiconductor layer to be a channel layer formed on the gate insulating film; a stacked film of a source electrode interconnection formed to extend above one end of the oxide semiconductor layer and a first hard mask layer for processing the source electrode interconnection; a stacked film of a drain electrode interconnection formed to extend above the other end of the oxide semiconductor layer and a second hard mask layer for processing the drain electrode interconnection; and a protective insulating film formed to cover a top face of the first hard mask layer, a side face of the source electrode interconnection, a top face of the oxide semiconductor layer, a top face of the second hard mask layer, and a side face of the drain electrode interconnection.

Moreover, another embodiment is a bottom gate channel etched thin film transistor using an oxide semiconductor layer for a channel layer, the thin film transistor being manufactured in the steps of: forming an Al-based metal film on a substrate including a gate electrode interconnection, a gate insulating film covering the gate electrode interconnection, and an oxide semiconductor layer to be a channel layer formed on the gate electrode interconnection through the gate insulating film; forming a hard mask film on the Al-based metal film; forming a resist pattern having a pattern for forming a source electrode interconnection and a drain electrode interconnection on the hard mask film; a first hard mask layer corresponding to a source electrode interconnection pattern for etching the hard mask film using the resist pattern for a mask and a second hard mask layer corresponding to a drain electrode interconnection pattern; first ashing for removing the resist pattern; dry etching the Al-based metal film using the first hard mask layer and the second hard mask layer for masks with a chlorine gas, forming the source electrode interconnection and the drain electrode interconnection, and exposing the oxide semiconductor layer; second ashing for removing a residual chlorine gas component after the dry etching; and forming a protective insulating film so as to cover a side wall of the source electrode interconnection, a surface of the oxide semiconductor layer, and a side wall of the drain electrode interconnection.

DETAILED DESCRIPTION

Figure 8:
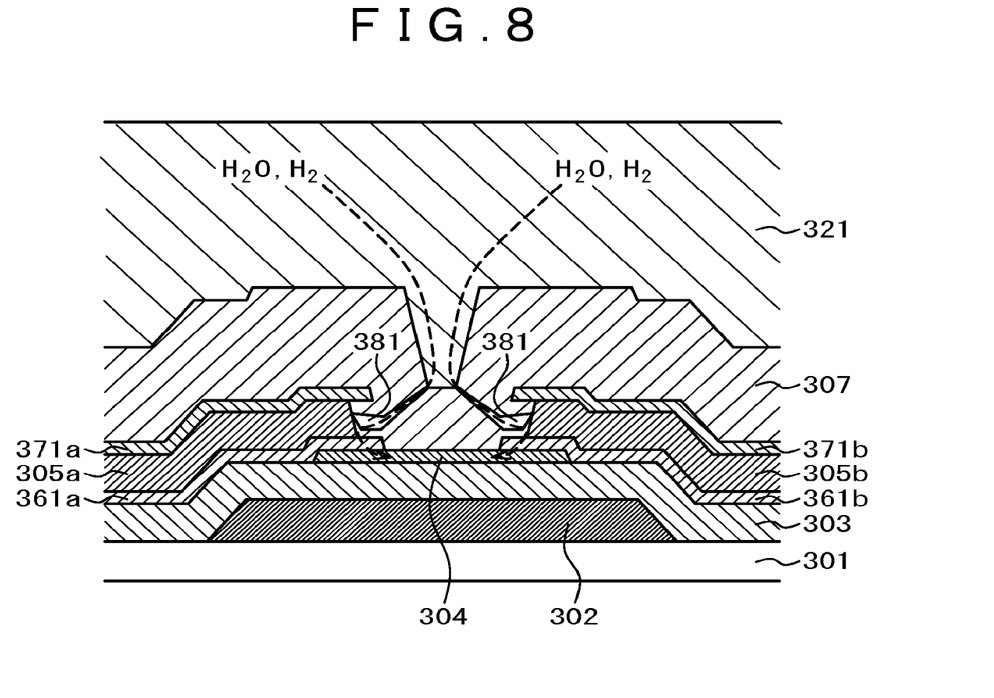
FIG. 8 is a cross sectional view of a thin film transistor investigated by the inventors.

The inventors investigated causes of initial Vth depletion and a Vth shift in a bottom gate channel etched thin film transistor formed with a source electrode interconnection and a drain electrode interconnection by dry etching. FIG. 8 is a cross sectional view of a thin film transistor investigated by the inventors. A gate electrode interconnection 302 is formed on an insulating substrate 301, and an oxide semiconductor layer 304, which is a channel layer, is formed above the gate electrode interconnection 302 through a gate insulating film 303. A source electrode interconnection 305a is disposed on the oxide semiconductor layer 304 through a source electrode interconnection contact layer 361a, an antireflective layer 371a is disposed on the source electrode interconnection, a drain electrode interconnection 305b is disposed on the oxide semiconductor layer 304 through a drain electrode interconnection contact layer 361b, and an antireflective layer 371b is disposed on the drain electrode interconnection. Moreover, a protective insulating film 307 and an organic planarization film 321 are formed so as to cover the surface of the oxide semiconductor layer 304 and the side wall or upper part of the source electrode interconnection 305a, the drain electrode interconnection 305b, or the like. It is noted that names of the source, the drain, and the like are provided for convenience, and in the case where one is referred to as a source, the other can be referred to as a drain.

As a result that the cross sectional view of the thin film transistor illustrated in FIG. 8 was observed in detail, it was revealed that the antireflective layer formed an eave over the source electrode interconnection and the drain electrode interconnection and a "void" 381 was formed in the protective insulating film 307 below the cave and extended to the organic planarization film 321. It was estimated that the organic planarization film 321 included moisture and hydrogen and the oxide semiconductor layer became a conductor and affected on the threshold voltage. Broken lines in FIG. 8 express routes that moisture and hydrogen are easily entered.

Therefore, the cave of the antireflective layer was investigated. The cave is not easily formed as long as the side wall protective film formed in dry etching functions. However, the thickness of the side wall protective film is prone to be varied depending on the pattern in the panel plane. For example, in the pixel TFT portion in a display panel, the pattern density is small, and the ratio of the area of the remaining resist with respect to the etched area is small. Thus, the supply of carbon materials from the resist is small, and the side wall protective film is prone to be thin. In contrast to this, interconnections are routed and a plurality of TFTs and other components are formed on a peripheral circuit unit in the display panel, and the pattern density is great. Thus, the ratio of the area of the remaining resist with respect to the etched area is great as compared with the pixel TFT portion. Therefore, it was estimated that the supply of carbon materials from the resist is great and the side wall protective film is easily thickened.

Figure 9:
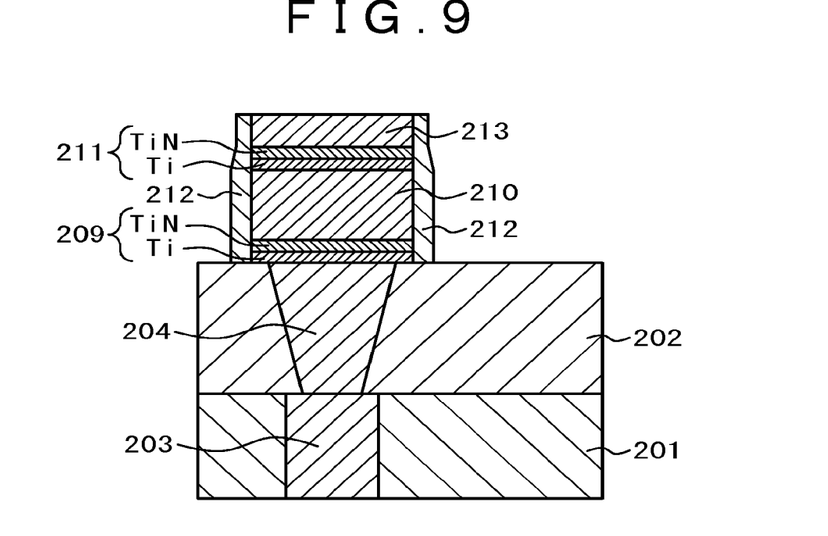
FIG. 9 is a cross sectional view illustrative of the essential part of a related art of an interconnection structure.

Moreover, the thickness of the side wall protective film is also prone to be varied depending on the channel width (W) or the channel length (L) of the TFT. For example, in the high definition panel in these years, the channel width and channel length of the pixel TFT are decreasing. However, it was revealed that at these places, carbon materials are not easily entered to the side wall in dry etching and the side wall protective film is prone to be thin. On the other hand, components such as an output TFT in a greater width are formed on the peripheral circuit unit for driving the pixel TFT, and at these places, carbon materials are easily entered to the side wall and the side wall protective film tends to be thick. It is noted that Japanese Patent Application Laid-Open No. 2013-4606 discloses a technique of forming a side wall protective film. FIG. 9 is a cross sectional view illustrative of the essential part of an interconnection structure described in Japanese Patent Application Laid-Open No. 2013-4606, and it is disclosed that when an AlCu interconnection 210 is dry etched using an $SiO_2$ layer 213 for a hard mask, a side wall protective film 212 is formed. A reference numeral 201 denotes a first interlayer film, a reference numeral 202 denotes a second interlayer film, a reference numeral 203 denotes the lower portion of a contact plug, a reference numeral 204 denotes the upper portion of the contact plug, and reference numerals 209 and 211 denote a TiN/Ti stacked film. However, since the thickness of the side wall protective film is varied depending on the position or the shape of the electrode interconnection as described above, it was difficult to apply this technique unchanged in the thin film transistor investigated by the inventors.

In the case where the side wall protective film is thin, side etching is easily applied to an Al interconnection material. Therefore, it was estimated that the amount of side etching is prone to be varied between the pixel and the peripheral circuit unit, for example, in the panel.

Moreover, the Al interconnection is desirably formed on a Ti film in order to secure an excellent contact performance with the oxide semiconductor layer. Moreover, a Ti film is desirably further formed as an antireflective layer on the Al interconnection. In this Ti/Al interconnection material/Ti stacked structure, the etching rate is varied depending on metal materials, and the amount of side etching is prone to be varied on the side walls. Generally, the amount of side etching of the Al interconnection material is great, and irregularities are easily formed on the side face.

Furthermore, in the Al interconnection material, a chlorine (Cl) gas is generally used for dry etching, and it is known that the remaining Cl reacts with moisture to cause HCl and corrosion is prone to occur. In addition, for example, in the TiW/Al interconnection material/TiW stacked structure, a battery reaction occurs between different kinds of metal materials, and the Al interconnection material corrodes more. Because of these points, in order to remove Cl remaining in the resist or the like as much as possible, the following is generally performed in which dry etching is performed, oxygen plasma is then generated, and the resist is removed by ashing.

Moreover, since the bond strength between oxygen and carbon is great, it was estimated that the side wall protective film formed of a carbon material is easily removed in the pixel TFT having a thin side wall protective film, for example, more than in the TFT having a thick side wall protective film of the peripheral circuit unit in ashing. Therefore, in the pixel TFT having a thin side wall protective film, for example, in the case where the resist is removed in the process step subsequent to ashing, side etching is easily applied to the Al stacked interconnection, for example, using an alkaline solution, for example.

Furthermore, in the bottom gate channel etched TFT, the protective insulating film is generally formed on the source electrode and the drain electrode. In the case of the oxide TFT, a protective insulating film (a silicon oxide film) is generally formed by CVD. However, according to the investigation conducted by the inventors, in the case of the oxide TFT, it is difficult to increase the film forming temperature of the protective insulating film to a temperature of 300° C. or greater. This is because oxygen is easily desorbed from the oxide semiconductor layer when the temperature is increased. After oxygen is deficient in the oxide semiconductor film, excess electrons behave as carriers. When this behavior is observed, the initial Vth is easily depleted in the oxide TFT. In Vth depletion, in the case where the panel includes a peripheral circuit, it is difficult to operate the peripheral circuit. Thus, it was revealed that a temperature of 300° C. or less is preferable to the film forming temperature of the SiO protective film for the oxide TFT.

On the other hand, from the point of the coverage of the source electrode interconnection and the drain electrode interconnection, the film forming temperature is desirably a temperature of 300° C. or greater. In order to secure excellent coverage for a source electrode interconnection and a drain electrode interconnection in a thick film, the film forming temperature is more desirably a temperature of 300° C. or greater. Therefore, at a film forming temperature of 300° C. or less, in the case where the amount of side etching of an Al interconnection material is large, the coverage of the protective insulating film is defective, and "voids" are likely to be produced on the side walls of the source electrode interconnection and the drain electrode interconnection after the SiO protective film is formed.

Moreover, an organic planarization film is often formed on the pixel TFT of a high definition liquid crystal panel. This organic planarization film generally contains a large amount of moisture. A part of the moisture is spread to the pixel TFT side in the heating process step after forming the organic planarization film. In the case where "voids" are produced on the side walls of the source electrode and the drain electrode, moisture or hydrogen that is spread from the organic planarization film easily reaches the oxide semiconductor layer as compared with the case where coverage is excellent. The oxide semiconductor layer becomes a conductor due to the moisture, and the Vth is easily depleted.

Moreover, in dry etching the Al interconnection material, the resist is also etched in a certain amount. However, the etching rate of the resist is slower than the etching rate of a film to be etched (in this case, the Al interconnection material). At this time, a carbon material, hydrogen, or moisture is supplied from the etched resist. Furthermore, a C or a CH gas is sometimes added to a Cl gas for the purpose of reinforcement of the side wall protective film. In dry etching, in order to suppress the residue of the etched film, etching is not stopped immediately after the etched film is removed (just etching), and etching is continued for a certain time period after an under layer film appears (over etching). Therefore, the under layer oxide semiconductor film is directly exposed to a carbon material, hydrogen, or moisture from the resist for the time period. However, for example, carbon or hydrogen is likely to adversely affect the oxide semiconductor film typified by an IGZO film as described below.

Since carbon has a strong bond strength to oxygen under plasma in the process of dry etching, carbon ions or radicals generated from a resist or an added gas receive energy from plasma, and oxygen is easily desorbed from an oxide semiconductor. Thus, oxygen deficiency is likely to occur in the oxide semiconductor film. Therefore, such a problem arises in that the Vth of the oxide TFT is easily depleted.

Moreover, in the case where the back channel of the bottom gate channel etched oxide TFT includes a lot of carbon contamination, the reliability of the TFT is likely to deteriorate such as a large Vth shift caused by gate stress, for example.

Furthermore, hydrogen has properties that easily reduce a metallic element forming an oxide semiconductor film. Therefore, an oxide semiconductor film supplied with hydrogen easily becomes a conductor, and the Vth of the TFT is easily depleted.

As described above, immediately after dry etching the Al interconnection material, the resist is generally removed by ashing using oxygen plasma for the measures against corrosion.

In the ashing, when the power for generating plasma is increased or the stage temperature is increased in an ashing chamber (ashing apparatus) in order to promote the removal of the resist, oxygen plasma becomes intense. Therefore, it was revealed that although oxygen is supplied, such an event is sometimes observed that oxygen bonds in the oxide semiconductor layer are easily broken and oxygen deficiency is likely to occur.

In addition, the resist ashed by oxygen plasma is decomposed into $CO_2$ and $H_2O$. It was revealed that when this $H_2O$ is supplied to the oxide semiconductor layer, the TFT is easily depleted as described above.

As a result of the investigation described above, it was revealed that the problem of depletion in the bottom gate channel etched oxide TFT is caused by the use of a mask resist formed of an organic compound in dry etching the source electrode interconnection and the drain electrode interconnection and that it is desirable to use a mask resist material for a mask in dry etching other than a resist material formed of an organic compound for the measures against the problem. The present invention is made based on the findings.

More specifically, an aspect of the present invention is a thin film transistor and a display device using the same. The thin film transistor is a bottom gate channel etched thin film transistor, at least including a gate electrode interconnection, a gate insulating film, a channel layer, a source electrode interconnection, a drain electrode interconnection, and a protective insulating film. The channel layer is formed of an oxide semiconductor layer. A hard mask layer formed of an inorganic compound is formed on the source electrode interconnection and the drain electrode interconnection.

Moreover, the total film thickness of the hard mask layer and the protective insulating film formed on the source electrode interconnection and the drain electrode interconnection is thicker than the film thickness of the protective insulating film formed on the oxide semiconductor layer (on the back channel) exposed between the source electrode interconnection and the drain electrode interconnection.

Furthermore, the source electrode interconnection and the drain electrode interconnection are formed of an Al material, and may be formed in a stacked film with other metal materials.

In addition, for the hard mask layer, a silicon oxide film (SiO film), silicon nitride film (SiN film), and silicon oxynitride film (SiON film), for example, are preferable.

Moreover, the source electrode interconnection and the drain electrode interconnection may be formed in a stacked film.

Since the hard mask layer formed of an SiO film, for example, is formed, a resist mask formed of an organic compound is not used in dry etching the source electrode and the drain electrode formed of an Al material using a Cl gas. Therefore, it is possible to avoid a problem of the thickness of the side wall protective film caused by pattern density. Moreover, since the difference in the thickness of the side wall protective film is small even though ashing is performed using $O_2$ plasma (which is performed for measures against corrosion using a Cl gas, not for removing the resist). Thus, the difference in the amount of side etching does not easily occur in the resist removing process step later.

Furthermore, it is likely to cause the difference in the amount of side etching of the hard mask layer, the source electrode interconnection, and the drain electrode interconnection because the hard mask layer is formed. However, to this possibility, the shape of the side wall of the hard mask layer is formed in a preferable shape (the side wall is tapered at an acute angle, for example), and film quality is selected in which the hard mask layer is formed of an SiO film, for example, and is etched more or less using an etching gas (in processing the source electrode interconnection and the drain electrode interconnection). With this configuration, preferable dry etching conditions are adapted, so that it is possible to decrease the difference in the amount of side etching of the hard mask layer, the source electrode interconnection, and the drain electrode interconnection.

In addition, even though a temperature of 300° C. or less preferable to the oxide TFT is used for the film forming temperature of the protective insulating film, it is possible to secure an excellent coverage performance. Therefore, since "voids" are not easily formed between the side walls of the source electrode interconnection and the drain electrode interconnection and the protective insulating film, it is easily avoided that the oxide semiconductor layer becomes a conductor even though moisture is spread from the organic planarization film.

Moreover, even though the source electrode interconnection and the drain electrode interconnection are processed under the over etching conditions, the supply of a carbon material, hydrogen, or moisture is avoided, which is caused by the resist to the exposed oxide semiconductor layer disposed above. Therefore, the initial Vth of the oxide TFT is not easily depleted.

As described above, the main purpose of ashing after dry etching is to remove a Cl gas, so that the conditions can be relaxed more than in the case where the resist is generally removed (in the case of full ashing, for example). Therefore, the oxygen bond is not easily broken in the oxide semiconductor layer caused by strong oxygen plasma. Furthermore, since the generation of $CO_2$ or $H_2O$ due to the resist in ashing is avoided, the TFT is not easily depleted.

In the following, embodiments of the present invention will be described with reference to the drawings.

It is noted that the disclosure is merely an example, and appropriate modifications and alterations easily conceived by a person skilled in the art within the teachings of the present invention are of course included in the scope of the present invention. Moreover, in order to give more clear description in the drawings, the width, thickness, shape, and the like of compartments are sometimes schematically illustrated, which are however examples and are not intended to limit the interpretation of the present invention.

Furthermore, in the specification and the drawings, components similar to ones in the drawings already described are designated the same reference numerals and signs, and the detailed description of the components are sometimes appropriately omitted.

First Embodiment

A thin film transistor according to a first embodiment of the present invention will be described with reference to FIG. 1. The thin film transistor according to the embodiment is a bottom gate TFT including a channel protective layer. A gate electrode interconnection 102 is formed on an insulating substrate 101, and an oxide semiconductor layer 104, which is a channel layer, is formed on the gate electrode interconnection 102 through a gate insulating film 103. A source electrode interconnection 105a is disposed on the oxide semiconductor layer 104, and a hard mask layer 106a is disposed on the source electrode interconnection. A drain electrode interconnection 105b is disposed on the oxide semiconductor layer 104, and a hard mask layer 106b is disposed on the drain electrode interconnection. Moreover, a protective insulating film 107 is formed to cover the surface of the oxide semiconductor layer 104, the side walls of the source electrode interconnection 105a and the drain electrode interconnection 105b, and the upper part of the other layers.

Next, a method of manufacture of the thin film transistor will be described with reference to FIGS. 2A to 2F. First, the manufacture process steps of a structure illustrated in FIG. 2A will be described. The insulating substrate 101 is prepared, and a metal film is formed by sputtering. For the insulating substrate 101, a glass substrate is used, for example. Alternatively, such a glass substrate can be used, on which a silicon oxide film (SiO film) or a silicon nitride film (SiN) is formed for an undercoat film by plasma CVD.

Figure 2A:
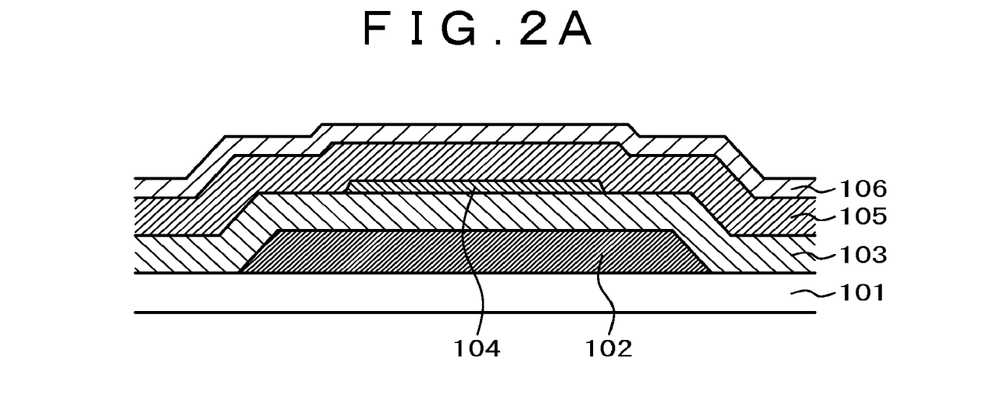
FIG. 2A is a cross sectional view illustrative of the manufacture process steps of the thin film transistor according to the first embodiment of the present invention (a hard mask insulating film is formed on a source and drain electrode interconnection film)

Subsequently, the gate electrode interconnection 102 is formed by photolithographic etching (wet or dry etching).

For the material of the gate electrode interconnection, a metal such as Nb, Mo, W, Ta, Cr, Ti, Fe, Ni, and Co, an alloy of them, or a stack of them is used, for example. Alternatively, in the embodiment, since the upper limit of the temperature in the entire process of fabricating a TFT can be decreased to a temperature of 400° C. or less, a low resistance metal such as Al and Cu can be used. It is desirable to form the film by sputtering. For the film thickness, such a film thickness is necessary that the interconnection resistance be not increased, and in the embodiment, a film thickness is 200 nm. However, values of the film thickness may be in a range of a thickness of 50 to 400 nm, for example.

Subsequently, the gate insulating film 103 is formed by plasma CVD. A silicon oxide film (SiO film) is preferable to the gate insulating film 103. However, a silicon oxynitride film (SiON film) or a stack of an SiO film and an SiN film, for example, can be used. Moreover, a TEOS film may be used. It is noted that it is desirable to form an SiO film on the oxide semiconductor layer 104 side (in order to prevent the oxide semiconductor layer 104 from easily being reduced due to a large amount of hydrogen in an SiN film). It is preferable to use plasma CVD for forming the SiO film.

However, thermal CVD, photo CVD, or the like in which the film forming temperature is low may be used other than plasma CVD. For a plasma CVD apparatus, one in a parallel plate type electrode structure and one in an antenna type electrode structure, for example, can be used. For forming an SiO film by plasma CVD, it is typical to supply $SiH_4$ (monosilane) or $N_2O$ (dinitrogen monoxide) as a raw material gas. It may be fine that a carrier gas such as Ar (argon) is further supplied simultaneously in the supply of a raw material gas in forming a film. The gas flow ratios of these gases are selected according to the performance of the apparatus and a substrate area. A frequency of 13.56 MHz is a typical RF frequency in plasma CVD. However, other frequencies may be used, other than the RF frequency. The value of RF power is selected according to the apparatus size or a substrate area.

Moreover, in the case of using a parallel plate type plasma CVD apparatus, it is fine that the distance between the electrodes is adjusted so as to maintain stable plasma discharge. For the film forming temperature, a temperature of 200° C. or greater is preferable to obtain film quality that can secure the withstand voltage for a gate insulating film and reliability of the TFT. On the other hand, in the case where the gate electrode interconnection 102 is formed of Al, for example, a temperature of 400° C. or less is desirable in order to suppress the occurrence of an abnormality such as a hillock. Furthermore, it is necessary to control a film forming pressure according to the RF frequency to be applied or the specifications of electrodes. In addition, the film thickness of the gate insulating film 103 is desirably in the range of a thickness of 100 to 400 nm, for example, in order to secure the gate withstand voltage and to prevent the film thickness from becoming thin at the lateral end portion of the gate electrode interconnection 102. On the other hand, the film thickness of the gate insulating film 103 is desirably a thickness of 400 nm or less, for example, in order to obtain a necessary drain current at a predetermined gate voltage. The following is a typical example of the film forming conditions.

Apparatus: parallel plate type plasma CVD
    Gas flow ratio: $SiH_4/N_2O=1/75$, for example
    RF frequency: 13.56 to 27.12 MHz
    RF power density: about 2 W/cm$^2$
    Electrode spacing: about 20 mm
    Substrate temperature: 350° C.
    Film forming pressure: 100 to 200 Pa Subsequently, the oxide semiconductor film is formed by sputtering. For the oxide semiconductor layer 104, an amorphous IGZO film is preferable. However, for materials, In—Zn oxides, in-Ga oxides, or the like may be used. Moreover, the film state may include crystallizability. It is preferable to use sputtering for forming the film. However, CVD may be fine if possible. For a sputtering apparatus, both a DC power supply type and an AC power supply type can be used. The target is desirably a material at the ratio In:Ga:Zn=1:1:1. However, the ratio can be changed more or less. When a film is formed by sputtering, oxygen ($O_2$) and Ar are introduced as sputtering gases. The flow rate and partial pressure of these gases are selected according to the performance of the apparatus and a substrate area. The film forming temperature can be the ambient temperature. However, the temperature is desirably increased to about a temperature of 100° C. in order to improve film quality. The film thickness ranges from a thickness of 5 to 50 nm. The specific resistance desirably ranges from 1E6 to 1E8 (Ω·cm), when a single film is formed. The following is typical film forming conditions.

Apparatus: DC sputtering apparatus
    $O_2$ partial pressure: 0.01 to 0.1 Pa
    Power density: 0.3 to 1 W/cm$^2$
    Substrate temperature: a temperature of 100° C.

Subsequently, the oxide semiconductor layer 104 is formed by photolithographic etching (wet etching). A wet etchant is an oxalic acid etchant, for example. The oxide semiconductor layer 104 is annealed in order to adjust film quality usable for the channel layer of the TFT from the film quality immediately after the layer is formed by sputtering. For the annealing atmosphere, the oxide semiconductor layer 104 is desirably annealed in an atmosphere, oxygen atmosphere, water vapor atmosphere, or atmosphere of nitrogen mixed with these atmospheres, for example. Moreover, the annealing temperature at a temperature of 400° C. or less is applicable. However, a temperature of 200° C. or greater is preferable in order to promote the annealing effect.

Subsequently, a metal film 105 is formed by sputtering on the oxide semiconductor film 104, which is to be the source electrode interconnection 105a and the drain electrode interconnection 105b. For metal film materials, a stacked film of an Al material (pure Al, AlSi, AlCu, AlSiCu, or the like) and a different metal material (Ti, TiN, TiW, or the like) can be used. Sputtering is desirable for forming the film. The film thickness may be a thickness of about 150 to about 1000 nm depending on materials in order to decrease interconnection resistance. The width of the interconnection is preferably a width ranging from about 1 to about 5 μm.

Subsequently, a film 106 to be a hard mask layer is formed on the metal film 105 to be the source electrode interconnection and the drain electrode interconnection. The structure illustrated in FIG. 2A is thus obtained. For the film 106 to be the hard mask layer, an insulating film such as an SiO film, SiN film, and SiON film, or a metal film such as MoW containing a large amount of a W component and TiN is applicable. In the case where the hard mask layers 106a and 106b are dry etched using a fluorine gas, for example, such a material (a material of a great selection ratio) is desirable whose etching rate is greater than the etching rate of the under source electrode interconnection 105a and the drain electrode interconnection 105b (Al interconnection material), and in the case where the source electrode interconnection 105a and the drain electrode interconnection 105b (Al interconnection material) are dry etched using a Cl gas, for example, such a material is desirable to the upper hard mask layers 106a and 106b whose etching rate is lower than the etching rate of the upper source electrode interconnection 105a and the drain electrode interconnection 105b.

It is noted that an SiO film, SiN film, and SiON film to be the hard mask layer can be formed by plasma CVD or sputtering. In the case where the hard mask layer is formed by CVD, a silane gas ($SiH_4$, for example) is generally used as one of raw material gases. Since silane gases contain hydrogen, it is likely that hydrogen is spread into the oxide semiconductor layer in the thermal process step. In addition, in the case of an SiN film, ammonia ($NH_3$) is supplied as one of raw material gases in addition to a silane gas. Therefore, it is desirable to decrease a hydrogen content in an SiO film, SiN film, and SiON film by adjusting the film forming conditions. Moreover, in order to suppress oxygen desorption from the oxide semiconductor layer 104, a temperature of 300° C. or less is preferable to the film forming temperature in the case of CVD. Furthermore, the hard mask layers 106a and 106b are necessary to remain as layers until the dry etching of the source electrode interconnection 105a and the drain electrode interconnection 105b is finished. It is necessary to select the film quality and film thickness of the film 106 in consideration of this point. For example, as in the case of the hard mask layers 106a and 106b formed of an SiO film formed using SiO by plasma CVD at a temperature of 300° C. or less, when the selection ratio between the material of the hard mask layer and the material of the source electrode interconnection and the drain electrode interconnection is not a great value so much (a selection ratio of about two), it is desirable to secure a film thickness of at least 75 to 500 nm in advance for the film thickness of the film 106. In the case of a film that can provide a great value of about ten for the selection ratio, the film thickness of the film 106 can be a thickness of about 10 nm.

Figure 2B:
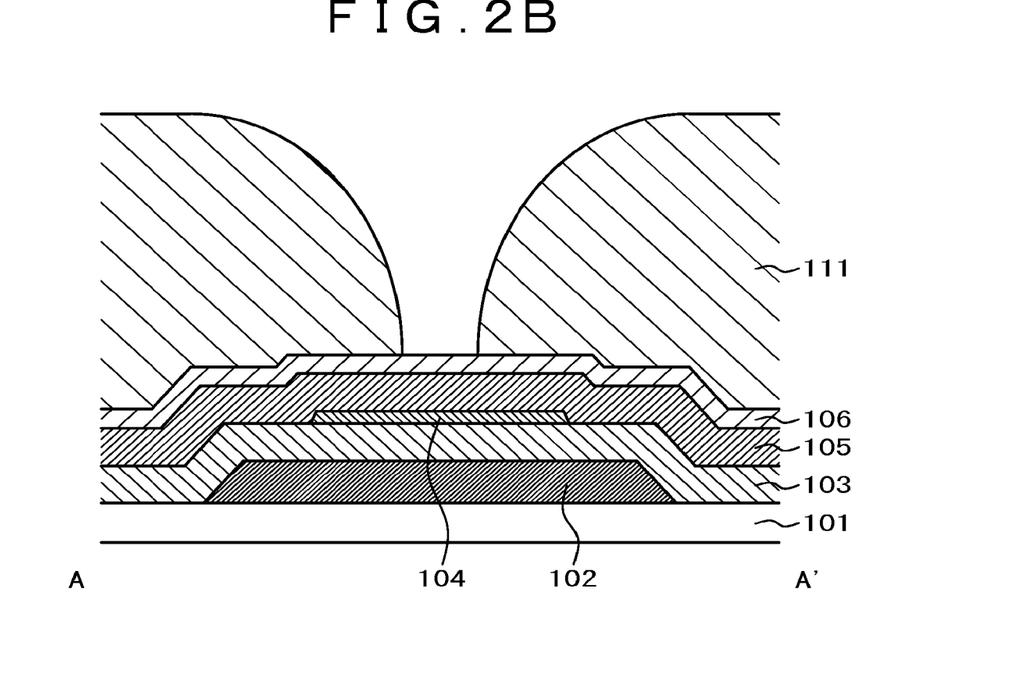
FIG. 2B is a cross sectional view illustrative of the manufacture process steps of the thin film transistor according to the first embodiment of the present invention (a resist pattern is formed on the hard mask insulating film)

Subsequently, as illustrated in FIG. 2B, a resist pattern 111 for patterning the film 106 to be the hard mask layer is formed by a photolithography process (by resist coating and development). FIG. 2F is a plan view when the resist pattern 111 is formed on the film 106 to be the hard mask layer. FIG. 2B is a cross sectional view taken along line A-A' in FIG. 2F.

Figure 2C:
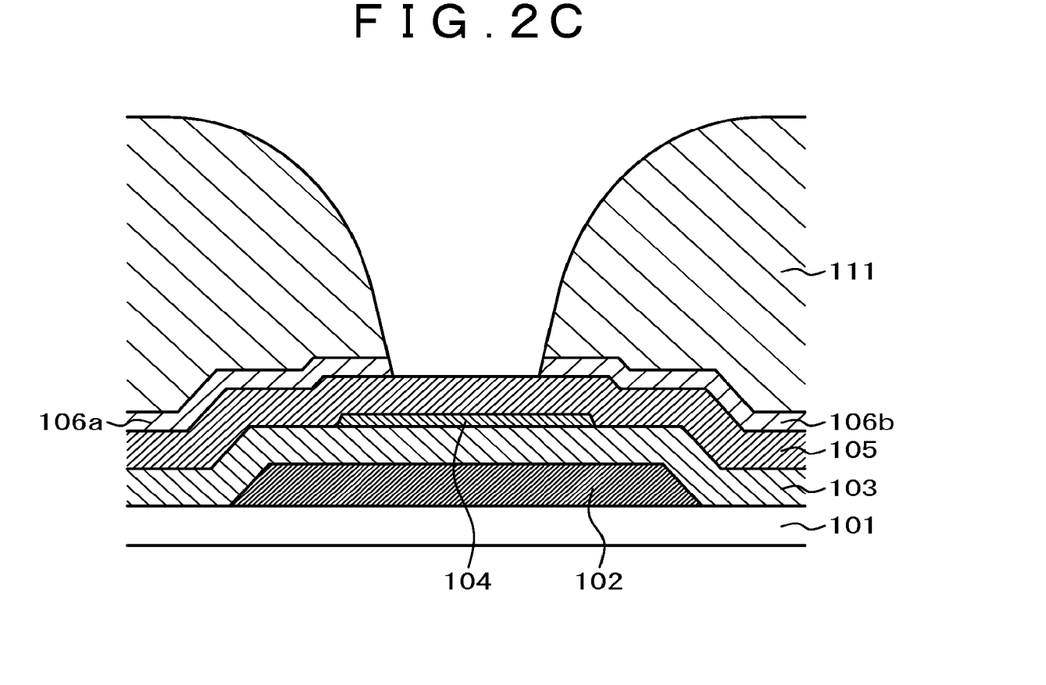
FIG. 2C is a cross sectional view illustrative of the manufacture process steps of the thin film transistor according to the first embodiment of the present invention (a hard mask layer is formed using the resist pattern for a mask)

Subsequently, as illustrated in FIG. 2C, the film 106 to be the hard mask layer is processed using the resist pattern 111 for a mask, and the hard mask layers 106a and 106b are formed. In the case where the hard mask layers 106a and 106b are formed of an SiO film, for example, it is desirable to supply a CF gas as a dry etching gas. When a CF gas is used, the source electrode interconnection 105a and the drain electrode interconnection 105b formed of an Al material are not etched so much even though a time period of over etching the hard mask layers 106a and 106b is prolonged. For a gas species, $CF_4$, $C_2F_4$, $C_3F_8$, $C_4F_8$, $CHF_3$, or the like or the combination of these species is supplied. It is possible to mix a carrier gas such as $N_2$ and Ar. Moreover, in the case where the hard mask layers 106a and 106b are formed of a MoW film, for example, it is fine that a gas such as $SF_6+O_2$ is supplied in dry etching the MoW film.

Figure 2D:
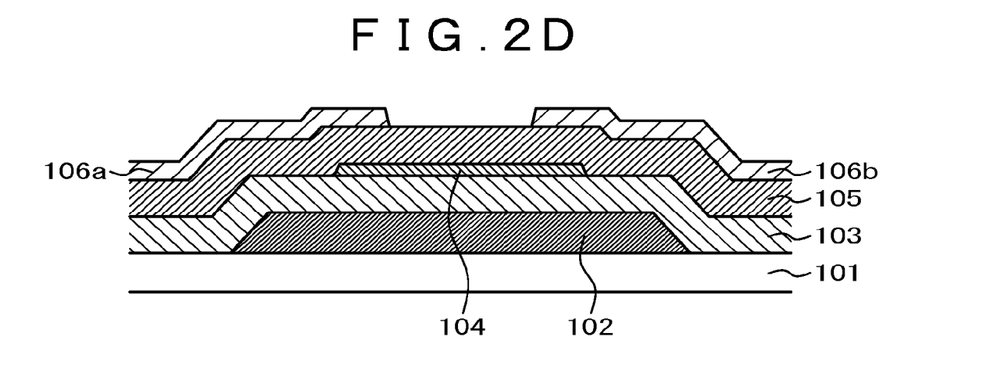
FIG. 2D is a cross sectional view illustrative of the manufacture process steps of the thin film transistor according to the first embodiment of the present invention (the resist pattern is removed)

Subsequently, as illustrated in FIG. 2D, the resist pattern on the hard mask layers 106a and 106b is removed by ashing (first ashing). The resist pattern is removed at this point in time, so that it is possible to suppress the adverse effect on the oxide semiconductor caused by $H_2O$, for example, generated from the resist in ashing the resist.

Figure 2E:
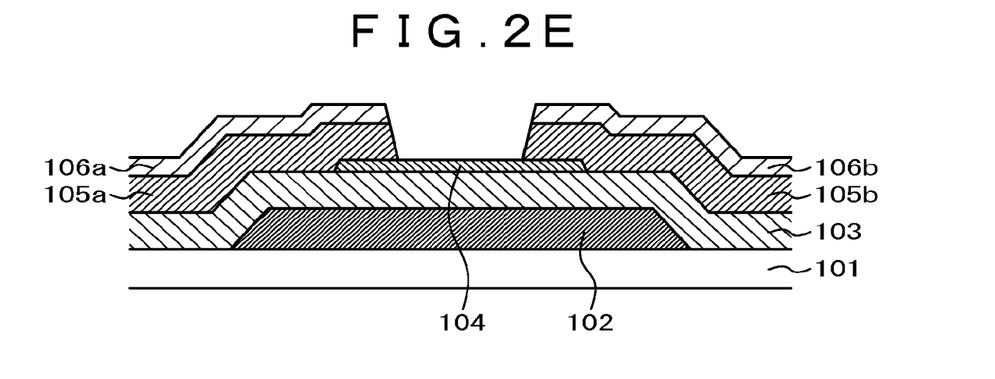
FIG. 2E is a cross sectional view illustrative of the manufacture process steps of the thin film transistor according to the first embodiment of the present invention (a source electrode interconnection and a drain electrode interconnection are formed using the hard mask layer for a mask)
Figure 2F:
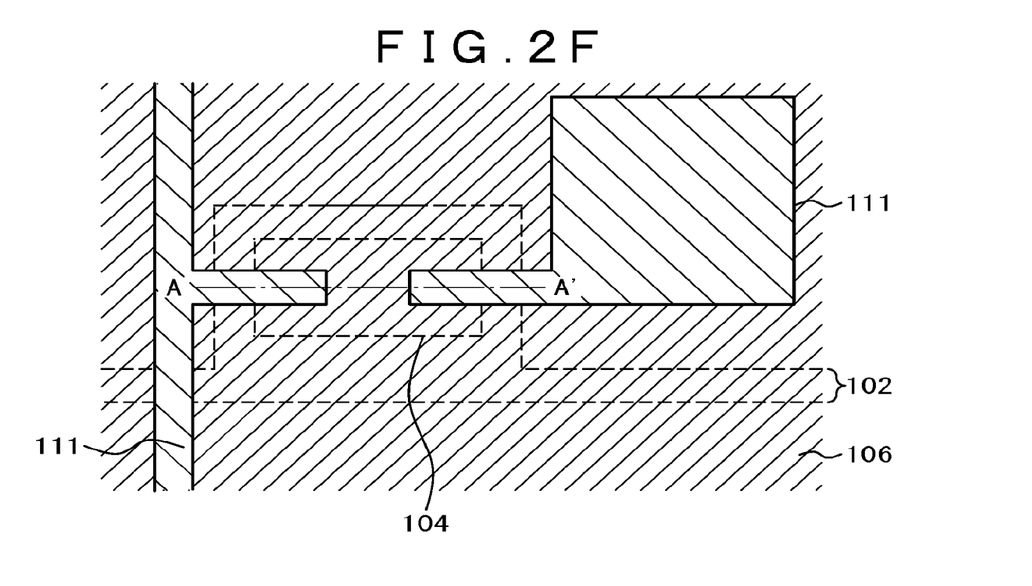
FIG. 2F is a plan view illustrative of the manufacture process steps of the thin film transistor according to the first embodiment of the present invention (a resist pattern is formed on the hard mask insulating film)

Subsequently, as illustrated in FIG. 2E, the metal film 105 is processed using the hard mask layers 106a and 106b for masks, and the source electrode interconnection 105a and the drain electrode interconnection 105b are formed. It is desirable to supply a Cl gas as a dry etching gas. Any Cl gases suppress the etching of the hard mask layers 106a and 106b. For a gas species, $Cl_2$, $Cl_2+BCl_3$, or the like is supplied. Moreover, in addition to mixing $O_2$, a carrier gas such as $N_2$ and Ar can be mixed. Since it is difficult to rely on the side wall protective film forming process using the resist, and it is also difficult to add a large amount of a CH gas, the amount of side etching the Al interconnection is likely to be increased even though the conditions for dry etching are devised (a reduction in the voltage, an increase in the bias, or the like).

Figure 7:
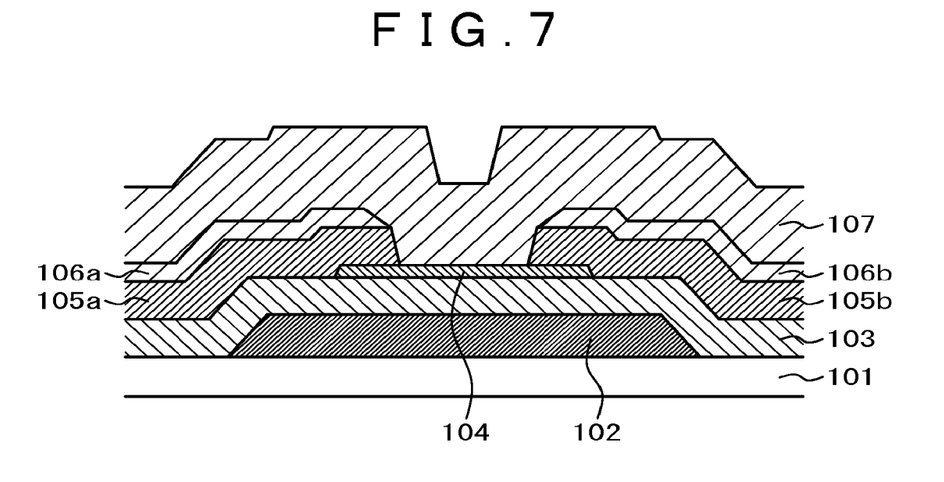
FIG. 7 is a cross sectional view of a thin film transistor according to a fourth embodiment of the present invention.

Therefore, it is desirable to adapt measures beforehand such as avoiding an increase in the thicknesses of the source electrode interconnection 105a and the drain electrode interconnection 105b, devising the hard mask layers 106a and 106b as illustrated in FIG. 7, described later, scaling down the mask dimensions from an originally desired width of the interconnection (the dimensions can be adjusted because the line width necessary for the source electrode interconnection and the drain electrode interconnection of a panel is a width ranging from about 1 to about 5 μm), and adjusting exposure in photolithography. It is noted that ashing after dry etching is performed for the main purpose of removal of the remaining Cl gas for measures against corrosion of the Al interconnection, so that the ashing conditions can be relaxed more than in the case of typical removal of the resist (in the case of full ashing, for example). In the embodiment, at this point in time, although the resist pattern does not exist, ashing after dry etching is called ashing (second ashing). It is noted that ashing includes plasma ashing using oxygen plasma and photo excited ashing using ozone, oxygen, and light. Therefore, oxygen deficiency does not easily occur on the oxide semiconductor layer caused by strong oxygen plasma. It is noted that the relaxation of the ashing conditions means a decrease in power for generating plasma and a decrease in the amount of oxygen gas introduced in the case if plasma ashing, and a decrease in light intensity and a decrease in the amount of ozone and oxygen introduced in the case of photo excited ashing, for example. Moreover, in the second ashing for removing residual chlorine gas components, the TFT is not, easily depleted because the generation of $CO_2$ or $H_2O$ is avoided, which is caused by the resist in the first ashing for removing the resist.

Subsequently, the protective insulating film 107 is formed, and the structure in FIG. 1 can be obtained. It is noted that an SiO film is preferable in which a raw material gas for forming the protective insulating film 107 is an $SiH_4/N_2O$ gas (more specifically, the content of hydrogen or moisture is small and the refractive index ranges from 1.46 to 1.48). For a method for forming the SiO film, CVD methods can be used. However, plasma CVD is preferably used. In this case, the electrode structure, carrier gas, and RF frequency are the same as those for the gate insulating film 103. The distance between the electrodes is adjusted so as to stably maintain plasma discharge. However, it is often convenient to change the flow ratio, RF power, film forming temperature, and the film thickness of the raw material gas as compared with the case of forming the gate insulating film 103. It is noted that it is desirable that the discharge amount of hydrogen molecules be $5\times10^{21}$ molecules/cm$^3$ or less and the discharge amount of water molecules be $3\times10^{21}$ molecules/cm$^3$ or less, when the protective insulating film is subjected to thermal desorption spectroscopy (TDS).

(a) Flow Ratios of Raw Material Gases

In order to suppress the reduction of the oxide semiconductor layer 104 caused by hydrogen and to suppress the oxide semiconductor layer 104 to be a conductor as much as possible, the flow ratio of $SiH_4$ is desirably smaller than the flow ratio of $N_2O$. However, it is not desirable that the flow ratio of $SiH_4$ be too small because a coarse film of a small refractive index is likely to be formed. Moreover, in order to suppress the oxide semiconductor layer 104 to be a conductor, it is desirable that the protective insulating film 107 be an oxygen rich film. However, when oxygen is excessively rich, such a harmful effect is sometimes observed as well that the reliability of the TFT is likely to deteriorate. Therefore, although depending on the size of the film forming apparatus, for example, typically, approximately the flow ratio $SiH_4:N_2O=1:20$ to 1:200 is desirable. Furthermore, the hard mask layers 106a and 106b serve as masks for the source electrode interconnection 105a and the drain electrode interconnection 105b, whereas a main purpose of the protective insulating film 107 is to suppress the oxide semiconductor layer 104 to be a conductor (to suppress the spread of external moisture and hydrogen and the supply of oxygen to the oxide semiconductor layer 104). Therefore, in the case where a silicon oxide film, for example, is used for both of the hard mask layers 106a and 106b and the protective insulating film 107, it is also possible to select the same film quality by adjusting the film forming conditions. However, it is possible to change film quality according to the purposes between two layers such as a film that has a high etch resistance for the hard mask layers 106a and 106b and a film that easily supplies oxygen for the protective insulating film 107.

(b) RF Power

In order to decrease damage caused by plasma against the oxide semiconductor layer 104 as much as possible, RF power is desirably lower.

However, it is not preferable that RF power be too low because the decomposition of the $N_2O$ gas is slow and a film of a high hydrogen content is likely to be formed.

(c) Film Forming Temperature

The film forming temperature is desirably lower in order to decrease damage against the oxide semiconductor layer 104 as much as possible. However, it is not preferable that the film forming temperature be too low because a film of a small refractive index and a film of a high hydrogen content and a high moisture content are likely to be formed.

(d) Film Thickness

In the case of a thick film thickness, hydrogen and moisture contained in the film are increased, and problems are likely to arise in that the spreads of hydrogen and moisture cause easy depletion of the Vth of the TFT and cause susceptibleness to gate stress, for example. On the other hand, when the film thickness is thin, the coverage of the source electrode interconnection 105a and the drain electrode interconnection 105b becomes easily defective, and the supply of oxygen becomes smaller. Therefore, although depending on the film thickness of the source electrode interconnection 105a and the drain electrode interconnection 105b, for example, the film thickness of the protective insulating film 107 is desirably a thickness of about 50 to about 500 nm (a greater film thickness of the source electrode interconnection 105a and the drain electrode interconnection 105b is desirable if possible).

From the description above, the following is typical film forming conditions.

Apparatus: parallel plate type plasma CVD
Gas flow ratio: $SiH_4/N_2O=1/100$, for example
RF frequency: 13.56 to 27.12 MHz
RF power density: 0.5 to 1.5 W/cm$^2$
Electrode spacing: approximately 300 mm
Substrate temperature: 150 to a temperature of 300° C.
Film forming pressure: 100 to 200 Pa Moreover, in order to oxidize the back channel of the oxide semiconductor layer 104 when the protective insulating film 107 is formed, it is also possible to additionally provide plasma processing using $N_2O$ or $O_2$. For the processing conditions, it is fine that $SiH_4$ is not introduced (or the amount of $SiH_4$ is as small as possible if introduced), and the conditions other than the condition are similar to the conditions when the SiO film is formed. Alternatively, such a method is also possible in which only $N_2O$ or $O_2$ is flowed without generating plasma.

Furthermore, an SiON film or SiN film can be stacked on an SiO film in order to form a film of a low moisture permeability (low hygroscopic properties) and a great refractive index. In the case of an SiN film, the film thickness is desirably about a thickness of 100 nm (it is desirable to avoid a thick film in a thickness of 250 nm or greater because some SiN films contain a large amount of hydrogen).

It is noted that in the embodiment, the film thickness of the protective insulating film 107 formed on the oxide semiconductor layer 104 (on the back channel) exposed between the source electrode interconnection and the drain electrode interconnection is smaller than the total film thickness of the hard mask layers 106a and 106b and the protective insulating film 107 formed on the source electrode interconnection and the drain electrode interconnection.

Figure 1:
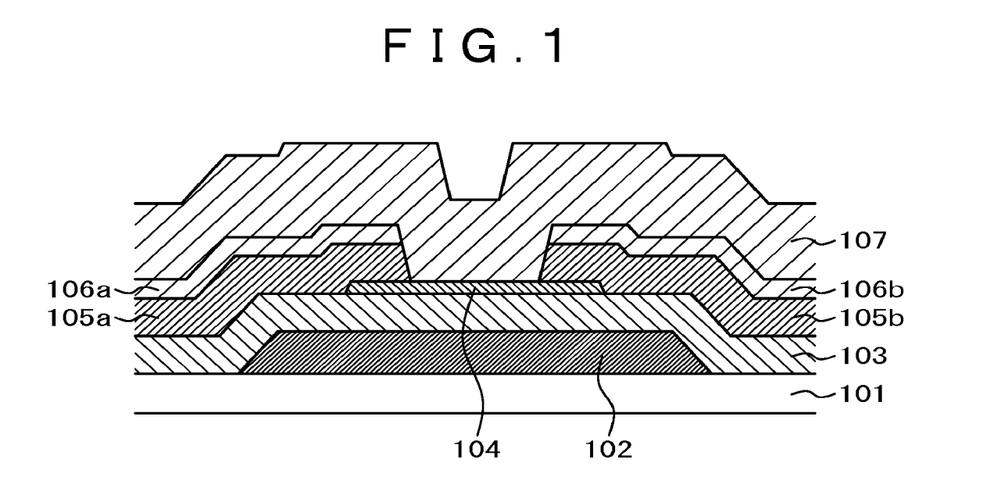
FIG. 1 is a cross sectional view of a thin film transistor according to a first embodiment of the present invention.

The organic planarization film was formed on the insulating substrate 101 on which the protective insulating film 107 illustrated in FIG. 1 was formed, and the TFT characteristics were evaluated. As a result, the occurrence of initial Vth depletion was not observed. Moreover, the phenomenon of a Vth shift was not recognized.

Figure 3:
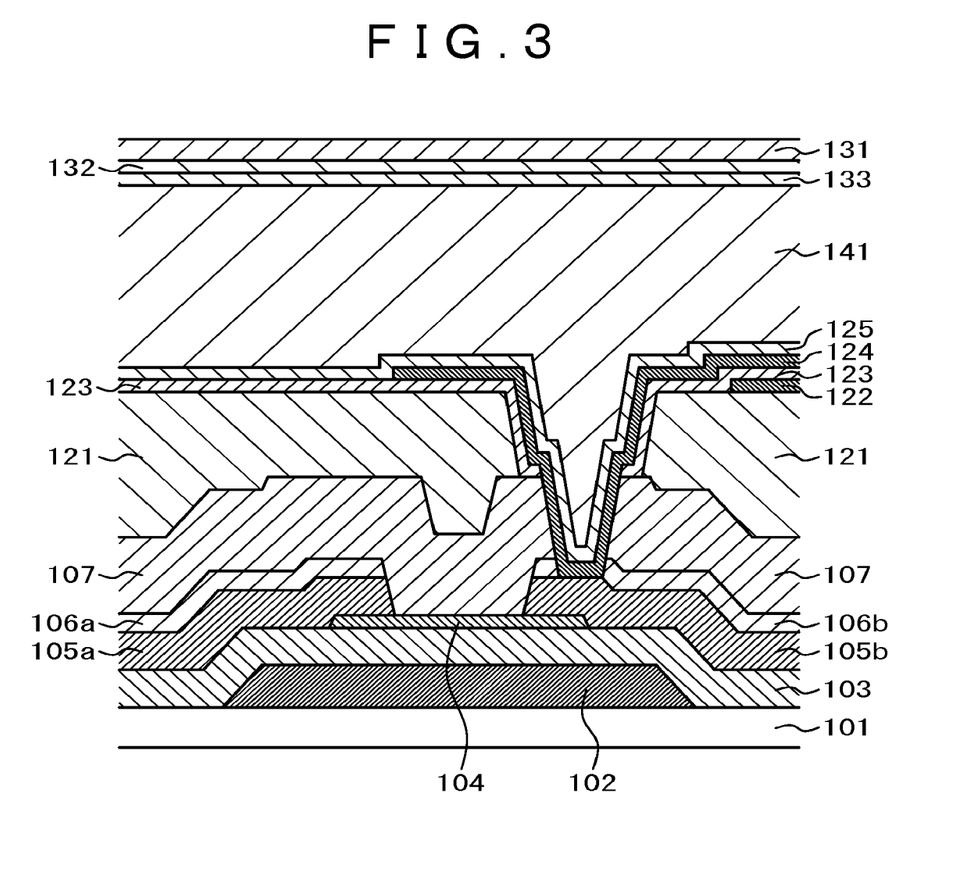
FIG. 3 is a cross sectional view of the essential part of a liquid crystal display device in IPS display mode including the thin film transistor according to the first embodiment of the present invention.

An example in which the thin film transistor shown in the embodiment is adapted to a display device will be described with reference to FIG. 3. FIG. 3 is a cross sectional view of the essential part of a liquid crystal display device in IPS display mode including the thin film transistor according to the first embodiment of the present invention. A common electrode 122 and a pixel electrode 124 are provided on the substrate on which the TFT is formed. The electrodes are used to apply an electric field to change the orientation of liquid crystal molecules in parallel with the substrate. In smartphones and tablet terminals nowadays, the IPS display mode is used as the standard because the visual angle characteristics are excellent. After the TFT is formed, an organic planarization film 121 formed of an organic resin, for example, is formed on the protective insulating film 107. After that, a contact hole is formed on the organic planarization film 121 of the drain electrode 105b.

Figure 10:
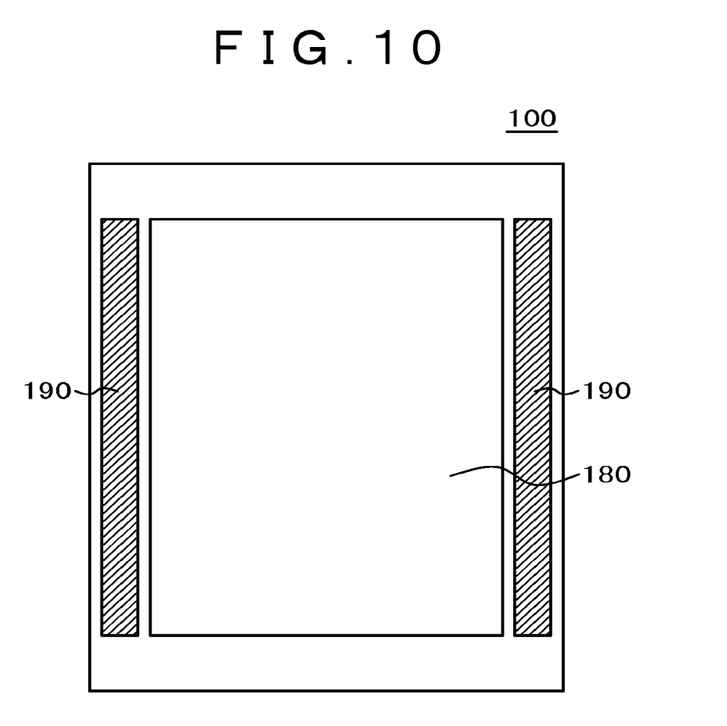
FIG. 10 is an overall schematic plan view of a display device according to the first embodiment of the present invention.

Subsequently, the common electrode 122 formed of an ITO film in a film thickness of 50 to 100 nm, for example, is processed and formed. Subsequently, a capacitive insulating film 123 is formed on the common electrode 122 and the organic planarization film 121 on which the common electrode 122 is not formed. An SiN film of a high relative dielectric constant is preferable to the capacitive insulating film 123. Moreover, a film thickness of 10 to 300 nm can be used depending on the pixel size. The pixel electrode 124 formed of an ITO film in a film thickness of 50 to 100 nm, for example, is processed and formed on a pixel forming region on the capacitive insulating film 123. After that, an alignment film 125 is formed on the pixel electrode 124. Subsequently, a counter substrate including a black matrix layer (BM) 131, a color filter layer 132, and an alignment film 133 is formed, and is attached to the substrate on which the TFT is formed. Liquid crystal 141 is sealed between the substrates, and then the liquid crystal display device illustrated in FIG. 3 is completed. It is noted that FIG. 10 is an overall schematic diagram of a display device. A display device 100 includes a display unit 180 and a drive circuit unit 190.

The TFT according to the embodiment is adapted, and Vth depletion and a ΔVth shift are suppressed. Therefore, in the liquid crystal panel, display unevenness or the like does not easily occur. It is noted that in FIG. 3, the TFT in the configuration illustrated in FIG. 1 is adapted. However, a TFT illustrated in other embodiments may be adapted. Moreover, the TFT is also applicable to liquid crystal display devices in other display modes, not limited to one in the IPS display mode.

Figure 4:
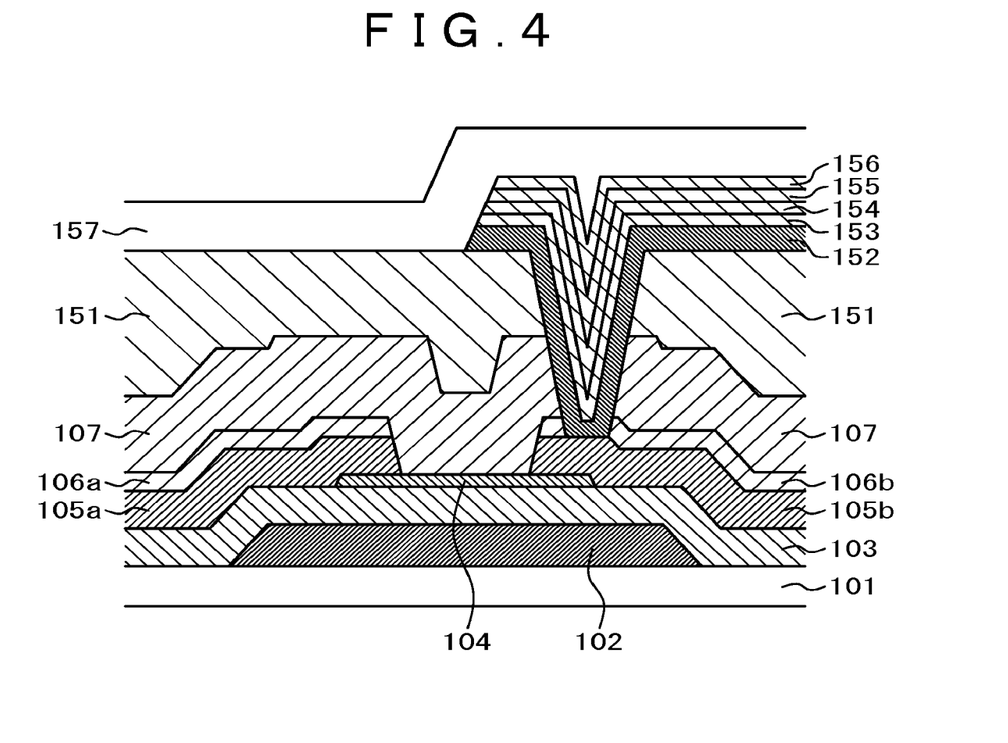
FIG. 4 is a cross sectional view of the essential part of an organic electroluminescent display device (OLED) including the thin film transistor according to the first embodiment of the present invention.

Another example in which the thin film transistor shown in the embodiment is adapted to a display device will be described with reference to FIG. 4. FIG. 4 is a cross sectional view of the essential part of an organic electroluminescent display device (OLED) including the thin film transistor according to the first embodiment of the present invention. After the TFT is formed, an organic planarization film 151 formed of an organic resin, for example, is formed on the protective insulating film 107, and then a contact hole is provided on a region of forming the drain electrode interconnection 105b. Here, a pixel electrode 152, formed of an Al film, for example, is formed. It is noted that a metal reflective film or a transparent electrode can be used for the pixel electrode 152, and the film thickness is preferably a thickness of 100 nm, for example. A charge transport layer 153, a light emitting layer 154, and a charge transport layer 155 of the OLED are formed on the pixel electrode 152 by vapor deposition, for example. Moreover, after an upper electrode 156 formed of a transparent conductive film is formed by vapor deposition, sputtering, or the like, a sealing film 157 is formed, and then the OLED display device illustrated in FIG. 4 is completed. The TFT according to the embodiment is adapted, and Vth depletion and a ΔVth shift are suppressed. Therefore, in the liquid crystal panel, display unevenness or the like does not easily occur. It is noted that in FIG. 4, the TFT in the configuration illustrated in FIG. 1 is adapted. However, a TFT illustrated in other embodiments may be adapted.

As described above, according to the embodiment, it is possible to provide a bottom gate channel etched thin film transistor that can suppress Vth depletion, initial Vth depletion, and a Vth shift, and a display device that display unevenness is decreased.

Second Embodiment

A thin film transistor according to a second embodiment of the present invention will be described with reference to FIG. 5. It is noted that matters described in the first embodiment and not described in this embodiment are also applicable to this embodiment unless otherwise specified.

Figure 5:
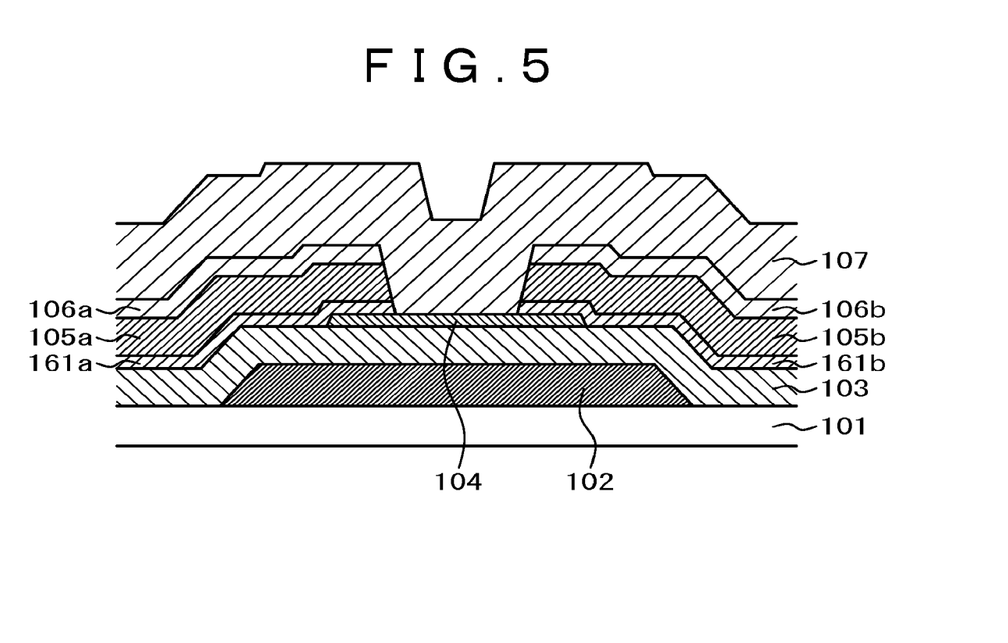
FIG. 5 is a cross sectional view of a thin film transistor according to a second embodiment of the present invention.

In FIG. 5, a contact layer 161a for a source electrode interconnection and a contact layer 161b for a drain electrode interconnection are formed between an oxide semiconductor layer 104 and a source electrode interconnection 105a and a drain electrode interconnection 105b. For the material of the contact layers 161a and 161b, Ti, TiN, or the like is preferable (which are materials easily dry etched by a Cl gas). The contact layers 161a and 161b are preferably formed continuously to the source electrode interconnection 105a and the drain electrode interconnection 105b by sputtering if possible. The film thickness can be selected from a film thickness in a range of a thickness of 5 to 100 nm according to the film thickness of the oxide semiconductor layer 104.

An organic planarization film was formed on an insulating substrate illustrated in FIG. 5 on which a protective insulating film 107 was formed, and the TFT characteristics were evaluated. As a result, the occurrence of initial Vth depletion was not observed. Moreover, the phenomenon of a Vth shift was not recognized.

Furthermore, the thin film transistor according to the embodiment was adapted to the display devices illustrated in FIGS. 3 and 4. As a result, it was enabled to obtain a display device in which display unevenness was suppressed.

According to the embodiment, the effect similar to the effect according to the first embodiment can be obtained. Moreover, the contact layers 161a and 161b formed of a Ti material are adapted, so that it is possible that the contact resistance of the oxide semiconductor layer 104 with the source electrode interconnection 105a and the drain electrode interconnection 105b is decreased, the mobility of the TFT is improved, and the ON current is increased.

Third Embodiment

A thin film transistor according to a third embodiment of the present invention will be described with reference to FIG. 6. It is noted that matters described in the first and second embodiments and not described in this embodiment are also applicable to this embodiment unless otherwise specified.

Figure 6:
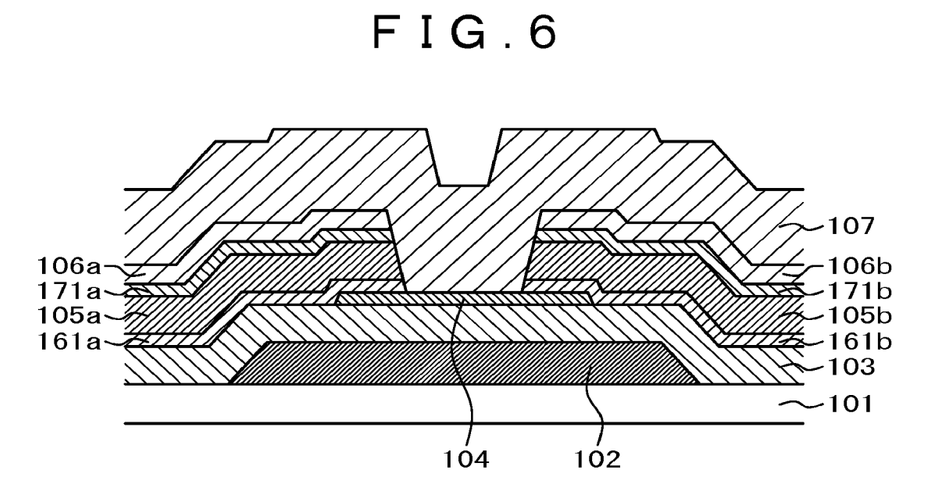
FIG. 6 is a cross sectional view of a thin film transistor according to a third embodiment of the present invention.

In FIG. 6, the point different from FIG. 5 is in that an antireflective layer 171a is formed between a source electrode interconnection 105a and a hard mask layer 106a and an antireflective layer 171b is formed between a drain electrode interconnection 105b and a hard mask layer 106b. For the material of the antireflective layers 171a and 171b, Ti, TiN, or the like is preferable (which are materials easily dry etched by a Cl gas). The antireflective layers 171a and 171b are preferably formed continuously to the source electrode interconnection 105a and the drain electrode interconnection 105b by sputtering if possible. The film thickness can be selected from a film thickness in a range of a thickness of 5 to 100 nm according to the film thickness of an oxide semiconductor layer 104. The film thickness can be selected from a film thickness in a range of a thickness of 5 to 100 nm.

An organic planarization film was formed on an insulating substrate illustrated in FIG. 6 on which a protective insulating film 107 was formed, and the TFT characteristics were evaluated. As a result, the occurrence of initial Vth depletion was not observed. Moreover, the phenomenon of a Vth shift was not recognized.

Furthermore, the thin film transistor according to the embodiment was adapted to the display devices illustrated in FIGS. 3 and 4. As a result, it was enabled to obtain a display device in which display unevenness was suppressed.

According to the embodiment, the effect similar to the effects according to the first and the second embodiments can be obtained. Moreover, the antireflective layers 171a and 171b formed of a Ti material are adapted, so that it is possible to suppress the generation of standing waves from light applied in photolithography exposure and reflected light from the under layer film and to improve the processing accuracy of the source electrode interconnection 105a and the drain electrode interconnection 105b.

Fourth Embodiment

A thin film transistor according to a fourth embodiment of the present invention will be described with reference to FIG. 7. It is noted that matters described in any one of the first to the third embodiments and not described in this embodiment are also applicable to this embodiment unless otherwise specified.

In FIG. 7, the point different from FIG. 1 is in that the end portions of hard mask layers 106a and 106b (on the side wall side of a source electrode interconnection and a drain electrode interconnection) are tapered at an acute angle (at a normal tapered angle of 30 to 70°). Thus, even in the case where the amount of side etching is varied among the hard mask layers, the source electrode interconnection, and the drain electrode interconnection, it is possible to decrease the difference in the amount of side etching by adjusting the tapered angle.

An organic planarization film was formed on an insulating substrate illustrated in FIG. 7 on which a protective insulating film 107 was formed, and the TFT characteristics were evaluated. As a result, the occurrence of initial Vth depletion was not observed. Moreover, the phenomenon of a Vth shift was not recognized.

Furthermore, the thin film transistor according to the embodiment was adapted to the display devices illustrated in FIGS. 3 and 4. As a result, it was enabled to obtain a display device in which display unevenness was suppressed.

According to the embodiment, the effect similar to the effect according to the first embodiment can be obtained. Moreover, when an SiO film, for example, is adapted as the hard mask layers 106a and 106b, etching advances by a Cl gas supplied in dry etching a source electrode interconnection 105a and a drain electrode interconnection 105b (although the etching rate is slower than the etching rate of an Al material). The side walls of the hard mask layers 106a and 106b are tapered at an acute angle, and the film thickness is decreased at the side wall portions. Therefore, the side walls are etched in etching using a Cl gas. Thus, it is possible to decrease the difference in the amount of side etching among the hard mask layers 106a and 106b, the source electrode interconnection 105a, and the drain electrode interconnection 105b.

A person skilled in the art can conceive various modifications and alterations in the scope of the teachings of the present invention, and it is understood that these modifications and alterations are also included in the scope of the present invention.

For example, configurations that the components are appropriately added to, deleted from, or modified in design, and that process steps are added, omitted, or modified in the conditions by a person skilled in the art are also included in the scope of the present invention as long as the teachings of the present invention are included.

Moreover, it is of course understood that the other operations and effects derived and apparent from the forms described in the embodiments or ones appropriately conceived by a person skilled in the art are derived from the present invention.

What is claimed is:

1. A bottom gate channel etched thin film transistor using an oxide semiconductor layer for a channel layer, the thin film transistor being manufactured in the steps of:
    forming an Al-based metal film on a substrate including a gate electrode interconnection, a gate insulating film covering the gate electrode interconnection, and an oxide semiconductor layer to be a channel layer formed on the gate electrode interconnection through the gate insulating film;
    forming a hard mask film on the Al-based metal film;
    forming a resist pattern having a pattern for forming a source electrode interconnection and a drain electrode interconnection on the hard mask film;
    forming a first hard mask layer corresponding to a source electrode interconnection pattern for etching the hard mask film using the resist pattern for a mask and a second hard mask layer corresponding to a drain electrode interconnection pattern;
    after forming the first hard mask layer and the second hard mask layer, first ashing for removing the resist pattern;
    after the first ashing, dry etching the Al-based metal film using the first hard mask layer and the second hard mask layer for masks with a chlorine gas, forming the source electrode interconnection and the drain electrode interconnection, and exposing the oxide semiconductor layer;
    second ashing for removing a residual chlorine gas component after the dry etching; and
    forming a protective insulating film so as to cover a side wall of the source electrode interconnection, a surface of the oxide semiconductor layer, and a side wall of the drain electrode interconnection.

2. The thin film transistor according to claim 1, wherein the protective insulating film is formed using an $SiH_4$ gas and an $N_2O$ gas at a substrate temperature in a range of a temperature of 150° C. to 300° C.

3. The thin film transistor according to claim 1, wherein the ashing after the dry etching is performed in a condition relaxed more than in the ashing for the resist pattern.

4. The thin film transistor according to claim 1, wherein a thickness of the protective insulating film on the oxide semiconductor layer is thinner than a total thickness of the first hard mask layer formed above the source electrode interconnection and the protective insulating film.

5. The thin film transistor according to claim 1, wherein in the protective insulating film, a discharge amount of hydrogen molecules is $5 \times 10^{21}$ molecules/cm$^3$ or less and a discharge amount of water molecules is $3 \times 10^{21}$ molecules/cm$^3$ or less in TDS analysis.

6. The thin film transistor according to claim 1, wherein a contact layer is formed between the oxide semiconductor layer and the source electrode interconnection and between the oxide semiconductor layer and the drain electrode interconnection.

7. The thin film transistor according to claim 2, wherein an antireflective layer is formed between the source electrode interconnection and the first hard mask layer and between the drain electrode interconnection and the second hard mask layer.

8. The thin film transistor according to claim 1, wherein end portions of the first hard mask layer and the second hard mask layer have a normal tapered angle ranging from an angel of 30 to 70°.

9. The thin film transistor according to claim 1, wherein the source electrode interconnection and the drain electrode interconnection are formed of an Al-based metal.

10. The thin film transistor according to claim 1, wherein the first and the second hard mask layers are formed of SiO, SiN, SiON, MoW, or TiN.

11. A display device comprising a display region and a drive circuit unit,
    wherein the thin film transistor according to claim 1 is disposed on the display region; and an organic planarization film is formed on the protective insulating film.

12. The display device according to claim 11,
wherein the display region includes liquid crystal and a color filter.

13. The display device according to claim 11,
wherein the display region includes a light emitting layer and a charge transport layer.

\* \* \* \* \*